United States Patent
Ishida

(10) Patent No.: US 8,448,031 B2
(45) Date of Patent: May 21, 2013

(54) COMPUTER PRODUCT AND APPARATUS FOR FAILURE DIAGNOSIS SUPPORT

(75) Inventor: Tsutomu Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 12/968,550

(22) Filed: Dec. 15, 2010

(65) Prior Publication Data

US 2011/0154139 A1 Jun. 23, 2011

(30) Foreign Application Priority Data

Dec. 17, 2009 (JP) ................................. 2009-286877

(51) Int. Cl.
*G01R 31/28* (2006.01)

(52) U.S. Cl.
USPC ........................................................ 714/724

(58) Field of Classification Search
USPC ................................................. 714/724, 726
See application file for complete search history.

(56) References Cited

U.S. PATENT DOCUMENTS

| | | | | |
|---|---|---|---|---|
| 5,422,891 A | * | 6/1995 | Bushnell et al. | 714/732 |
| 6,708,139 B2 | * | 3/2004 | Rearick et al. | 702/185 |
| 6,869,808 B2 | | 3/2005 | Yonezawa et al. | |
| 7,082,558 B2 | * | 7/2006 | Gupte et al. | 714/718 |
| 7,290,183 B2 | * | 10/2007 | Shimamura | 714/700 |
| 2005/0246599 A1 | * | 11/2005 | Simpson et al. | 714/724 |

FOREIGN PATENT DOCUMENTS

| | | |
|---|---|---|
| JP | 2003-043115 A | 2/2003 |
| JP | 2005-083895 A | 3/2005 |

* cited by examiner

*Primary Examiner* — Yolanda L Wilson
(74) *Attorney, Agent, or Firm* — Fujitsu Patent Center

(57) ABSTRACT

A recording medium stores a program causing a computer to execute determining, for each test pattern measuring operation frequency of a circuit and based on a predicted delay of each path in the circuit, a path candidate determining a measured value obtained via the test pattern and activated by the test pattern; building, for each test pattern yielding a measured value determined by a given path candidate determined at the determining, a model equation expressing discrepancy between the measured value obtained via the test pattern and the predicted delay of the given path candidate, the model equation including parameters representing effects of each path activated by the test pattern on the discrepancy; calculating values of the parameters by using the model equations; determining based on the calculated values, a path determining the measured value obtained via the test pattern and activated by the test pattern; and outputting the determined path.

10 Claims, 11 Drawing Sheets

FIG.6

MODEL DATA TABLE ~600

| | DELAY TEST RESULT ID | TEST PATTERN ID | FIRST PATH CANDIDATE ID | DISCREP- ANCY | OUTLIER FLAG |
|---|---|---|---|---|---|
| 600-11 | $R_{11}$ | t1 | p1 | $Dev(p1)_{11}$ | N |
| 600-21 | $R_{21}$ | t2 | p3 | $Dev(p3)_{21}$ | N |
| ⋮ | ⋮ | ⋮ | ⋮ | ⋮ | ⋮ |
| | $R_{n1}$ | tn | ... | ... | N |
| | $R_{12}$ | t1 | ... | ... | N |
| ⋮ | ⋮ | ⋮ | ⋮ | ⋮ | ⋮ |
| 600-ij | $R_{ij}$ | ti | p[k] | $Dev(pk)_{ij}$ | N |
| ⋮ | ⋮ | ⋮ | ⋮ | ⋮ | ⋮ |
| 600-nm | $R_{nm}$ | tn | ... | ... | N |

FIG.7

DIAGNOSIS RESULT TABLE ~700

| | TEST PATTERN ID | PATH ID | SUBJECT PATH ID |
|---|---|---|---|
| 700-1 | t1 | p1 | p3 |
| | t2 | p4 | - |
| ⋮ | ⋮ | ⋮ | ⋮ |
| 700-n | tn | ... | ... |

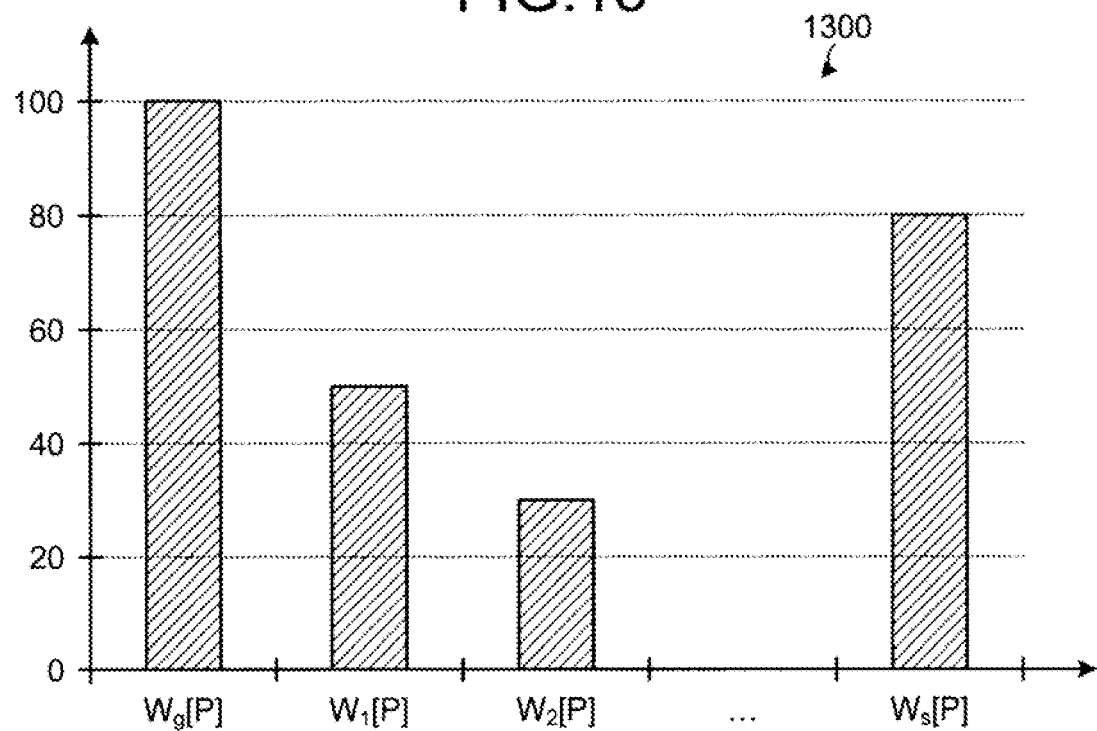

COMPUTER PRODUCT AND APPARATUS FOR FAILURE DIAGNOSIS SUPPORT

CROSS REFERENCE TO RELATED APPLICATIONS

This application is based upon and claims the benefit of priority of the prior Japanese Patent Application No. 2009-286877, filed on Dec. 17, 2009, the entire contents of which are incorporated herein by reference.

FIELD

The embodiments discussed herein are related to supporting diagnosis of a failure of a semiconductor integrated circuit.

BACKGROUND

In recent years, the influence of component irregularities, crosstalk, IR-drop, etc., has been increasing as processing becomes more refined, leading to a large discrepancy between path delay at the stage of a design process (predicted delay) and path delay on a manufactured chip (actual delay). If the discrepancy between the path delays becomes so large that a chip cannot satisfy a target operation frequency (specification) during a chip inspection process, a setback in the design process results.

In the inspection process, a delay test is carried out to confirm whether the chip satisfies the target operation frequency. In the delay test, a test pattern (test vector) is successively input twice to the chip to confirm the operation of the chip. In the delay test, specifically, the cycle of successive inputs of test patterns is shortened stepwise, and the cycle immediately before the point at which the chip becomes incapable of normal operation is identified to confirm whether the identified cycle satisfies a target cycle (frequency).

If the chip does not satisfy the target operation frequency, failure diagnosis is carried out to identify the location or cause of the failure, and a return to the design process is made. Failure diagnosis is carried out using the path delay of each of paths in the chip. According to conventional failure diagnosis, a path having a large predicted path delay estimated by static timing analysis (STA), statistical static timing analysis (SSTA), etc., is presumed to be a failure-causing path.

According to conventional failure diagnosis, a measured value obtained via a test pattern is assigned to a path presumed to be a failure-causing path and speed path analysis, etc. is performed to identify, in detail, the cause of failure. The measured value obtained from a test pattern is equivalent to the delay value immediately before the point of failure, i.e., the smallest interval at which two test patterns can be input to the chip and still yield output values that match expected values (see, for example, Japanese Laid-Open Patent Publication Nos. 2003-43115 and 2005-83895).

According to the conventional technique, however, if multiple paths are activated (propagate signals) simultaneously when a test pattern is input to the chip, precisely determining the failure-causing path is difficult, which leads to a problem of reduced reliability of the failure diagnosis.

Specifically, because a discrepancy exists between the predicted path delay and the actual path delay, a path with a large predicted path delay (e.g., greatest predicted delay) does not always determine the measured value obtained via a test pattern when multiple paths are activated. For this reason, if a path determining the measured value obtained via a test pattern is presumed simply from the predicted path delay, the accuracy of failure diagnosis deteriorates.

SUMMARY

According to an aspect of an embodiment, a non-transitory, computer-readable recording medium storing therein a failure diagnosis support program that causes a computer to execute a process including determining, for each test pattern used to measure operation frequency of a circuit subject to diagnosis, a path candidate that determines a measured value obtained via the test pattern, the path candidate being among a group of paths activated by the test pattern and determined based on a predicted delay of each path in the circuit; building, for each test pattern yielding a measured value that is determined by a given path candidate among path candidates determined at the determining, a model equation expressing a discrepancy between the measured value obtained via the test pattern and the predicted delay of the given path candidate, the model equation including parameters representing effects of each path activated by the test pattern on the discrepancy between the measured value obtained via the test pattern and the predicted delay of the given path candidate; calculating values of the parameter by using the model equations built at the building; determining from among the group of paths activated by the test pattern and based on a calculation result obtained at the calculating, a path that determines the measured value obtained via the test pattern; and outputting a determination result obtained at the determining a path.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is an explanatory diagram of an example of the contents of the model data table.

FIG. 7 is an explanatory diagram of an example of the memory contents of the diagnosis result table.

FIG. 13 is an explanatory diagram of an example of a failure diagnosis result.

DESCRIPTION OF EMBODIMENTS

Preferred embodiments of the present invention will be explained with reference to the accompanying drawings.

Figure 1:
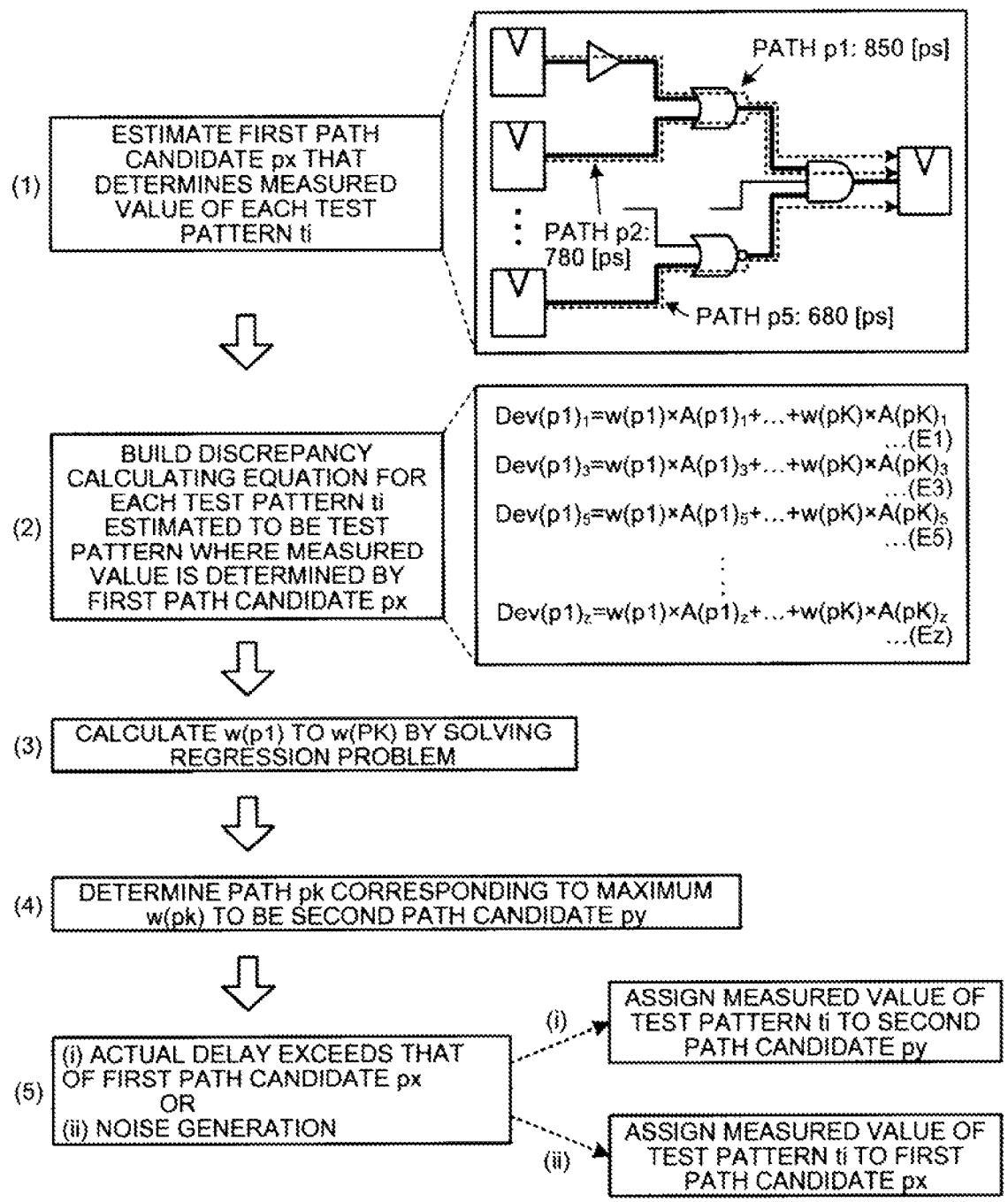
FIG. 1 is an explanatory diagram of one embodiment of a failure diagnosis support method.

FIG. 1 is an explanatory diagram of one embodiment of a failure diagnosis support method. In FIG. 1, a group of paths in a chip subject to diagnosis is represented as "group of paths p1 to pK", and an arbitrary path is represented as "path pk" (k=1, 2, . . . , K). Test patterns that do not satisfy the target operation frequency of the chip in a delay test are represented as "test patterns t1 to tn", and an arbitrary test pattern is represented as "test pattern ti" (i=1, 2, . . . , n).

(1) According to this method, a first path candidate px that determines the respective measured values obtained via the test patterns t1 to tn is estimated from among a group of paths that are activated simultaneously when each of the test patterns t1 to tn is input to a chip. Specifically, for example, a path having the greatest predicted delay (path delay) among a group of paths activated by a test pattern ti is presumed to be the first path candidate px. For example, for a test pattern t1, a path p1 having the greatest predicted delay among a group of paths p1, p2, and p5 is presumed to be the first path candidate px.

(2) According to this method, a discrepancy calculation equation is built for each test pattern ti yielding a measured value that is presumed to be determined by the first path candidate px. The discrepancy calculation equation is a model equation that expresses the discrepancy between the measured value obtained via the test pattern ti and the predicted delay of the first path candidate px and includes a parameter w(pk) representing the effect of a path pk activated by the test pattern ti on the discrepancy between the measured value obtained via the test pattern ti and the predicted delay of the first path candidate px.

The discrepancy calculation equation is, for example, expressed by equation (1), where $Dev(px)_i$ represents the discrepancy [ps] between the measured value obtained via the test pattern ti and the predicted delay of the first path candidate px, w(pk) represents an effect [ps] that each path pk exerts on $Dev(px)_i$ upon being activated, and $A(pk)_i$ represents a variable that takes a value of "1" in the case of activation by the test pattern ti and takes a value of "0" in the case of inactivation.

$$Dev(px)_i = w(p1) \times A(p1)_i + w(p2) \times A(p2)_i + \ldots + w(pK) \times A(pK)_i \quad (1)$$

In equation (1), $Dev(px)_i$ and $A(p1)_i$ to $A(pK)_i$ are values acquired from the result of a chip delay test. A case is assumed where the path p1 is presumed to be the first path candidate px that determines the respective measured values obtained via test patterns t1, t3, t5, . . . , tz. In this case, according to this method, discrepancy calculation equations (E1), (E3), (E5), . . . , (Ez) are built for the test patterns t1, t3, t5, . . . , tz, respectively.

(3) According to this method, a regression problem is solved using multiple discrepancy calculation equations (e.g., calculation equations (E1), (E3), (E5), . . . , (Ez)) built respectively for each test pattern ti to determine w(pk) representing the effect each path pk exerts on Dev(px)i.

(4) According to this method, the path pk corresponding to the maximum w(pk) among w(p1) to w(pK) included in the discrepancy calculation equation for the test pattern ti is presumed to be a second path candidate py (where, x≠y). The path pk corresponding to the maximum w(pk) is a path that when activated, creates a large discrepancy between the predicted delay of the first path candidate px and the measured value obtained via test pattern ti.

Therefore, (i) the path pk corresponding to the maximum w(pk) may be a path whose actual delay exceeds the actual delay of the first path candidate px, i.e., a path that potentially determines the measured value obtained via the test pattern ti.

Further, (ii) the path pk corresponding to the maximum w(pk) may be a path that generates noise with the first path candidate px. Hence, according to this method, the path pk corresponding to the maximum w(pk) is presumed to be the second path candidate py that determines the measured value obtained via the test pattern ti.

(5) According to this method, the possible cases (i) and (ii) are distinguished from each other using a delay test result. As a result, in the case of (i) where the path pk corresponding to the maximum w(pk) is a path whose actual delay exceeds the actual delay of the first path candidate px, the second path candidate py is determined to be the path pk corresponding to the maximum w(pk) and the measured value is assigned to the second path candidate py. In the case of (ii) noise generation path, the first path candidate px is determined to be the path that determines the measured value obtained via the test pattern ti and the measured value is assigned to the first path candidate px.

Thus, according to this method, differentiation can be made between a case where "the actual delay of the second path candidate py exceeds that of the first path candidate px" and a case of "noise generation" between the first and second path candidates px and py presumed to be paths determining the measured value obtained via the test pattern ti, enabling the measured value to be assigned to the proper path to improve the reliability of failure diagnosis.

Figure 2:
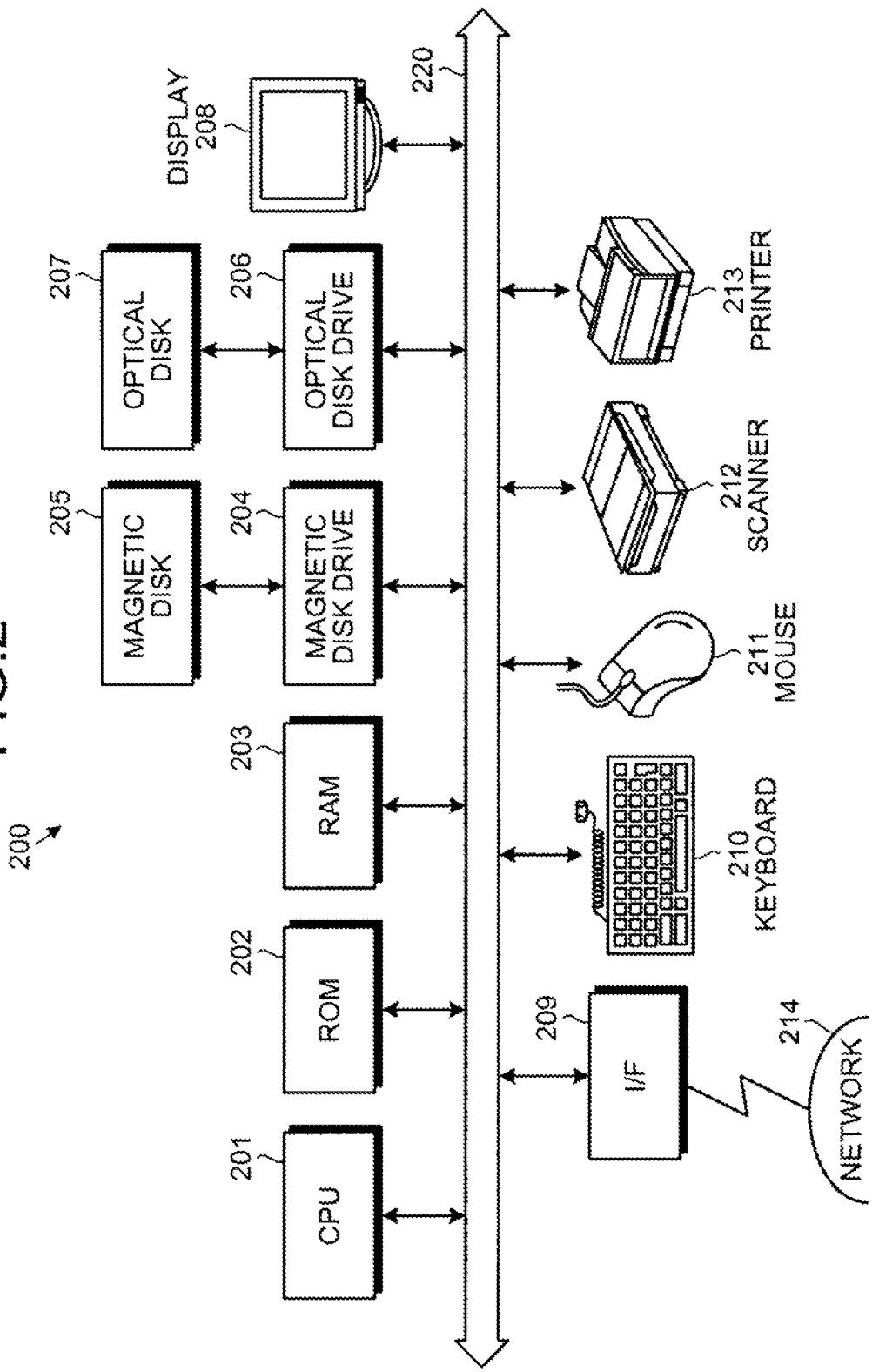
FIG. 2 is a block diagram of a hardware configuration of a failure diagnosis support apparatus according to the embodiment.

FIG. 2 is a block diagram of a hardware configuration of a failure diagnosis support apparatus 200 according to the embodiment. As depicted in FIG. 2, the failure diagnosis support apparatus 200 includes a central processing unit (CPU) 201, a read-only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213, respectively connected by a bus 220.

The CPU 201 governs overall control of the failure diagnosis support apparatus 200. The ROM 202 stores therein programs such as a boot program. The RAM 203 is used as a work area of the CPU 201. The magnetic disk drive 204, under the control of the CPU 201, controls the reading and writing of data with respect to the magnetic disk 205. The magnetic disk 205 stores therein data written under control of the magnetic disk drive 204.

The optical disk drive 206, under the control of the CPU 201, controls the reading and writing of data with respect to the optical disk 207. The optical disk 207 stores therein data written under control of the optical disk drive 206, the data being read by a computer.

The display 208 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 208.

The I/F 209 is connected to a network 214 such as a local area network (LAN), a wide area network (WAN), and the Internet through a communication line and is connected to other apparatuses through the network 214. The I/F 209 administers an internal interface with the network 214 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch-panel-type input pad or numeric keypad, etc. may be adopted. The mouse 211 is used to move the cursor, select a region, or move and change the size of windows. A track ball or a joy stick may be adopted provided each respectively has a function similar to a pointing device.

The scanner 212 optically reads an image and takes in the image data into the failure diagnosis support apparatus 200. The scanner 212 may have an optical character reader (OCR) function as well. The printer 213 prints image data and text data. The printer 213 may be, for example, a laser printer or an ink jet printer.

Figure 3:
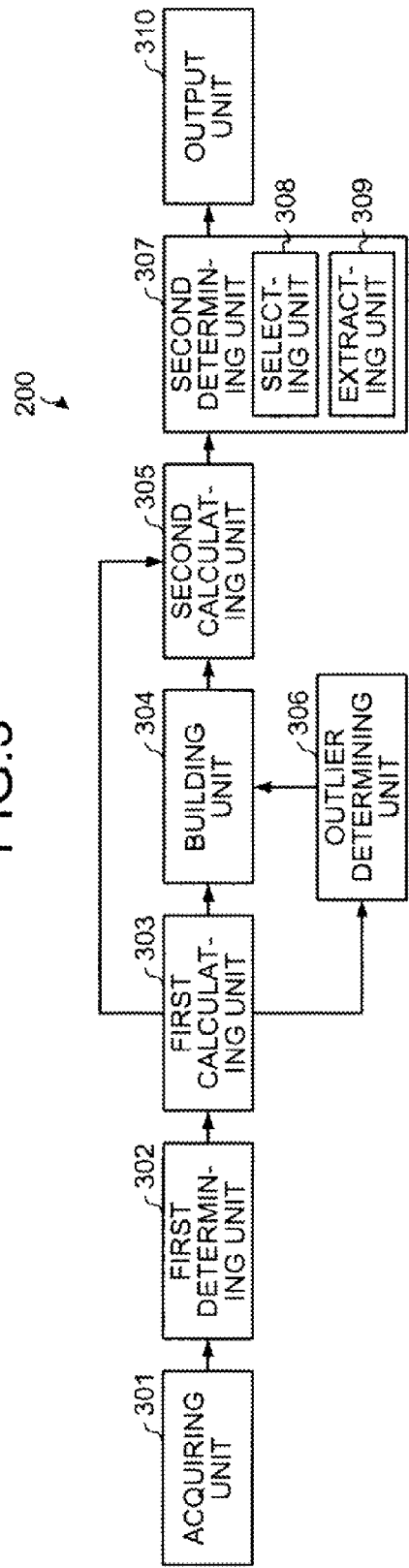
FIG. 3 is a block diagram of a functional configuration of the failure diagnosis support apparatus.

FIG. 3 is a block diagram of a functional configuration of the failure diagnosis support apparatus. As depicted in FIG. 3, the failure diagnosis support apparatus 200 includes an acquiring unit 301, a first determining unit 302, a first calculating unit 303, a building unit 304, a second calculating unit 305, an outlier determining unit 306, a second determining unit 307, a selecting unit 308, an extracting unit 309, and an output unit 310.

These functional units (the acquiring unit 301 to the output unit 310) are implemented, for example, when programs stored in a memory device such as the ROM 202, the RAM 203, the magnetic disk 205, and the optical disk 207 depicted in FIG. 2 are executed by the CPU 201 or via the I/F 209. The result of processing by each functional unit is stored to a memory device such as the RAM 203, magnetic disk 205, and optical disk 207, unless otherwise specified.

The acquiring unit 301 depicted in FIG. 3 has a function of acquiring the result of a delay test on a circuit subject to diagnosis. The circuit subject to diagnosis is a circuit manufactured by using circuit information concerning the circuit, which is, for example, a group of chips on a single wafer. The result of a delay test is the result of a delay test on each test pattern for measuring the operation frequency of a chip.

In the following description, a group of chips on a single wafer manufactured by using circuit information concerning a circuit to be subject to diagnosis is expressed as "group of chips C1 to Cm", and an arbitrary chip in the group of chips C1 to Cm is expressed as "chip Cj" (j=1, 2, . . . , m). Test patterns that do not cause the chip Cj to satisfy a target operation frequency in a delay test are expressed as "test patterns t1 to tn", and an arbitrary test pattern is expressed as "test pattern ti" (i=1, 2, . . . , n). A group of paths in each chip Cj are expressed as "group of paths p1 to pK", and an arbitrary path in the group of paths p1 to pK is expressed as "path pk" (k=1, 2, . . . , K).

Figure 4:
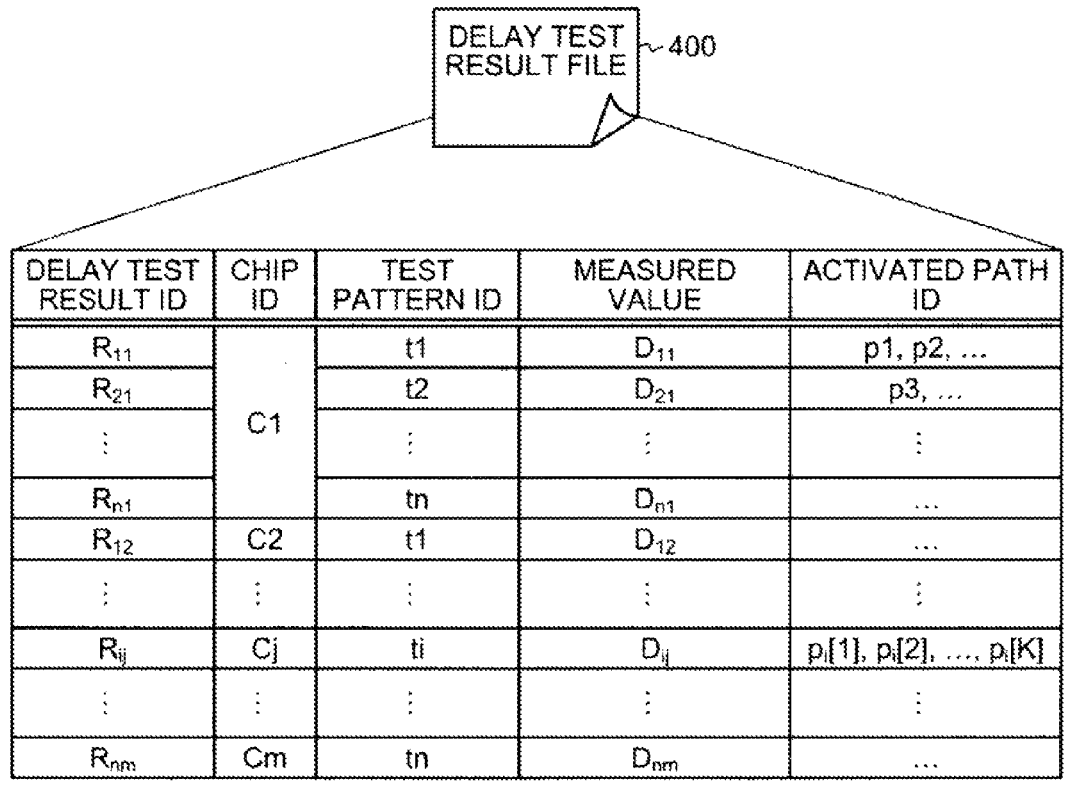
FIG. 4 is an explanatory diagram of an example of a delay test result.

A specific example of a delay test result will be described. FIG. 4 is an explanatory diagram of an example of a delay test result. As depicted in FIG. 4, a delay test result file 400 includes items of delay test result ID, chip ID, test pattern ID, measured value, and activated path ID. Information is set for each item to store delay test results $R_{11}$ to $R_{nm}$ as records.

The delay test result ID represents an identifier for identifying each of the delay test results $R_{11}$ to $R_{nm}$. The chip ID represents an identifier for identifying each chip Cj. Test pattern ID represents an identifier for identifying each test pattern ti. The measured value represents a delay value [ps] immediately before the point of failure of a chip Cj in the case of successively inputting test patterns ti twice to the chip Cj.

The activated path ID represents an identifier for identifying a path pk that is activated when the test pattern ti is input to the chip Cj. In the case of a delay test result $R_{ij}$, for example, inputting the test pattern ti to the chip Cj gives a measured value "$D_{ij}$" and activates paths "$p_i[1], p_i[2], \ldots, p_i[K]$". A group of paths that are activated upon input of the test pattern ti are common to all chips C1 to Cm.

The acquiring unit 301 depicted in FIG. 3 has a function of acquiring a predicted delay value dk for each path pk in the chip Cj. The predicted delay value dk is the delay value [ps] of each path pk estimated at the stage of designing by STA, SSTA, etc. An example of a delay analysis result for each path pk will be described.

Figure 5:
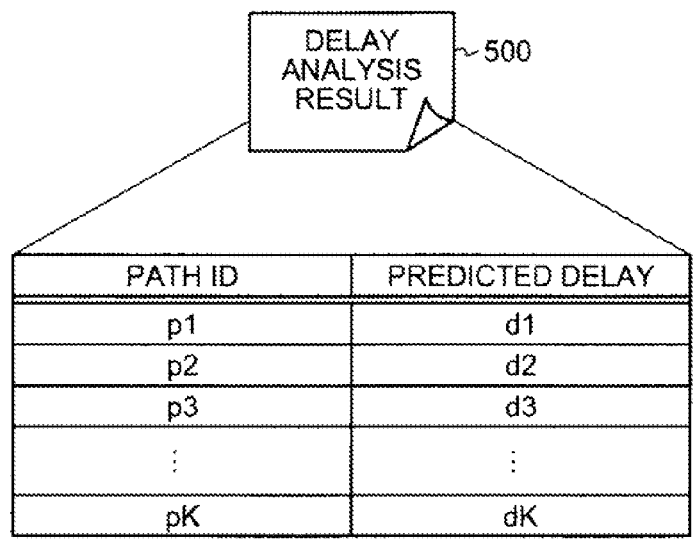
FIG. 5 is an explanatory diagram of an example of a delay analysis result.

FIG. 5 is an explanatory diagram of an example of a delay analysis result. As depicted in FIG. 5, a delay analysis result 500 includes items of path ID and predicted delay and thus, includes the predicted delay value dk for each path pk. The predicted delay value dk of the path pk is common to all chips C1 to Cm.

The first determining unit 302 depicted in FIG. 3 has a function of determining, based on the predicted delay value dk of each path pk in the chip Cj and from among the group of paths $p_i[1]$ to $p_i[K]$ activated by the test pattern ti, the first path candidate px that determines the measured value $D_{ij}$ obtained via the test pattern ti. A first path candidate px is, for example, determined for each test pattern ti in each chip Cj.

The first determining unit 302 thus carries out a determining process m×n times (=number of chips m×number of test patterns n). In this determining process, a given path pk may be determined to be the first path candidate px that determines measured values $D_{ij}$ obtained via multiple test patterns ti. In this embodiment, a discrepancy calculation equation built by the building unit 304, which will be described later, is to be solved by statistical analysis.

Therefore, a multiplicity of discrepancy calculation equations are built to increase the volume of data to be processed by statistical analysis. A path pk having a large predicted delay value dk is highly likely to determine measured values $D_{ij}$ obtained via many test patterns. Hence, the first determining unit 302 may determine the path pk having the greatest predicted delay dk among the group of paths $p_i[1]$ to $p_i[K]$ to be the first path candidate px.

In this manner, a multiplicity of discrepancy calculation equations are built to carry out more precise statistical analysis. The result of determination by the first determining unit 302 is stored to a model data table 600 depicted in FIG. 6. The model data table 600 is implemented by, for example, a memory device such as the RAM 203, the magnetic disk 205, and the optical disk 207.

FIG. 6 is an explanatory diagram of an example of the contents of the model data table. The model data table 600 depicted in FIG. 6 includes items of delay test result ID, test pattern ID, first path candidate ID, discrepancy, and outlier flag. Information is set for each item to store model data 600-11 to 600-nm for test results $R_{11}$ to $R_{nm}$ as records.

The delay test result ID represents an identifier for identifying each of the test results $R_{11}$ to $R_{nm}$. The test pattern ID represents an identifier for identifying each test pattern ti. The first path candidate ID represents an identifier for identifying a first path candidate px. Discrepancy represents a discrepancy between the measured value $D_{ij}$ obtained via the test pattern ti and the predicted delay value dx of the first path candidate px in the chip Cj.

The outlier flag represents an identifier for identifying any one of the test results $R_{11}$ to $R_{nm}$ that includes a discrepancy caused by such elements as delay faults and random irregularities (outlier). Under the outlier flag item, "Y (Yes)" is entered when the delay test result $R_{ij}$ is an outlier, while "N (No)" is entered when the delay test result $R_{ij}$ is not an outlier. The outlier flag is set to "N" in the initial state.

The first calculating unit 303 depicted in FIG. 3 has a function of calculating a discrepancy between the measured value $D_{ij}$ obtained via the test pattern ti and the predicted delay value dx of the first path candidate px in the chip Cj. The measured value $D_{ij}$ is the measured value from the delay test result $R_{ij}$ entered in the measured value item in the delay test result file 400. The predicted delay dx is the predicted delay of the path px entered in the predicted delay item in the delay analysis result 500.

For example, the first calculating unit 303 is able to calculate the discrepancy between the measured value $D_{ij}$ obtained via the test pattern ti and the predicted delay value dx of the first path candidate px in the chip Cj using equation (2), where $Dev(px)_{ij}$ denotes the discrepancy between the measured value $D_{ij}$ obtained via the test pattern ti and the predicted delay value dx of the first path candidate px in the chip Cj.

$$Dev(px)_{ij} = D_{ij} - dx \quad (2)$$

The result of calculation by the first calculating unit 303 is, for example, stored to the model data table 600. Specifically, for example, the discrepancy $Dev(px)_{ij}$ between the measured value $D_{ij}$ and the predicted delay value dx is entered in the discrepancy item space corresponding to the delay test result $R_{ij}$ in the model data table 600.

The building unit 304 has a function of building a discrepancy calculation equation $E(px)_{ij}$ for each test pattern ti yielding a measured value $D_{ij}$ that is determined by the first path candidate px. The discrepancy calculating equation $E(px)_{ij}$ is a model equation expressing the discrepancy $Dev(px)_{ij}$ between the measured value $D_{ij}$ obtained via the test pattern ti and the predicted delay value dx of the first path candidate px.

The discrepancy $Dev(px)_{ij}$ is expressed by a polynomial having a variable representing a discrepancy between the predicted delay and the actual delay of each of the paths $p_i[1]$ to $p_i[K]$ activated upon input of the test pattern ti to the chip Cj. Specifically, for example, the building unit 304 builds the discrepancy calculation equation $E(px)_{ij}$ using equation (3).

In equation (3), $Dev(px)_{ij}$ denotes the discrepancy [ps] between the measured value $D_{ij}$ obtained via the test pattern ti and the predicted delay value dx of the first path candidate px, w(pk) denotes an effect [ps] each path pk exerts on $Dev(px)_{ij}$ upon being activated (k=1, 2, ..., K), and $A(pk)_{ij}$ denotes a variable that takes a value of "1" when the path pk is activated upon input of the test pattern ti to the chip Cj and takes a value of "0" when the path pk is not activated.

$$Dev(px)_{ij} = w(p1) \times A(p1)_{ij} + w(p2) \times A(p2)_{ij} + w(pK) \times A(pK)_{ij} \quad (3)$$

The number of discrepancy calculation equations $E(px)_{ij}$ built is equivalent to the number of test patterns yielding measured values $D_{ij}$ that are determined by the first path candidate px. When the test patterns t1 to tn are input to each of the chips C1 to Cm and the first path candidate px determines the measured values $D_{ij}$ obtained via X test patterns ti, the number of the discrepancy calculation equations $E(px)_{ij}$ is m×X.

The second calculating unit 305 has a function of calculating the values of w(p1) to w(pK) included in each discrepancy calculation equation $E(px)_{ij}$ using multiple discrepancy calculation equations $E(px)_{ij}$ built for each first path candidate px. Specifically, for example, the second calculating unit 305 substitutes the discrepancy $Dev(px)_{ij}$ between the measured value $D_{ij}$ and the predicted delay value dx calculated by the first calculating unit 303 into each discrepancy calculating equation $E(px)_{ij}$.

The second calculating unit 305 then refers to the activated path ID item corresponding to the delay test result $R_{ij}$ in the delay test result file 400 and substitutes "0" or "1" for $A(p1)_{ij}$ to $A(pK)_{ij}$ included in the discrepancy calculation equation $E(px)_{ij}$. Specifically, for example, if the path pk is entered in the activated path ID item, the second calculating unit 305 substitutes "1" for $A(pk)_{ij}$. If the path pk is not entered in the activated path ID item, the second calculating unit 305 substitutes "0" for $A(pk)_{ij}$.

As a result, the number of built equations having unknowns representing $w(p_i[1])$ to $w(p_i[K])$ of the group of paths $p_i[1]$ to $p_i[K]$ activated upon input of the test pattern ti is equivalent to the number of test patterns yielding measured values $D_{ij}$ that are determined by the first path candidate px (e.g., m×X patterns).

Subsequently, the second calculating unit 305 solves a regression problem for the discrepancy calculation equations $E(px)_{ij}$ to calculate $w(p_i[1])$ to $w(p_i[K])$ included in each discrepancy calculation equation $E(px)_{ij}$. More specifically, for example, the second calculating unit 305 calculates the $w(p_i[1])$ to $w(p_i[K])$ that minimize error between the left side and the right side of each discrepancy calculation equation $E(px)_{ij}$ by support vector machine (SVM) regression.

While the regression problem is solved for the discrepancy calculation equations $E(px)_{ij}$ for all the chips C1 to Cm according to the description above, this is not the only method. For example, a regression problem may be solved for the discrepancy calculation equations $E(px)_{ij}$ according to chip to calculate the averages of w(p1) to w(pK).

Some of the delay test results $R_{11}$ to $R_{nm}$ include a discrepancy caused by elements of delay failures, random irregularities, etc. A delay test result $R_{ij}$ including such a discrepancy is unnecessary and not appropriate for calculating the $w(p_i[1])$ to $w(p_i[K])$. The delay test result $R_{ij}$ including a discrepancy caused by elements of delay failures, random irregularities, etc., therefore, may be excluded as an outlier from delay test results for which the discrepancy calculation equation $E(px)_{ij}$ is to be built.

For example, the first calculating unit 303 calculates the average $M_i$ of the measured values $D_{ij}$ obtained via the test patterns ti for all chips C1 to Cm. Subsequently, the outlier determining unit 306 compares the measured value $D_{ij}$ obtained via the test pattern ti in each chip Cj with the average $M_i$, and determines the measured values $D_{ij}$ to be an outlier if the difference between the measured values $D_{ij}$ and the average $M_i$ is equal to or greater than a threshold $H_i$.

The threshold $H_i$ may be set arbitrarily. For example, the first calculating unit 303 may determine α[%] (e.g., α=10) of the average $M_i$ of the measured values $D_{ij}$ obtained via the test patterns ti to be the threshold $H_i$. The result of determination by the outlier determining unit 306 is stored, for example, to the model data table 600. Specifically, "Y" is entered in the outlier flag item space corresponding to the delay test result $R_{ij}$ determined to be an outlier in the model data table 600.

In this case, the building unit 304 excludes the delay test result $R_{ij}$ having a corresponding outlier flag item set to "Y" in the model data table 600, from delay test results from which the discrepancy calculation equation $E(px)_{ij}$ is to be built. Hence, a delay test result $R_{ij}$ that includes an unnecessary discrepancy is excluded, enabling the w(p1) to w(pK) to be calculated more accurately.

The method of determining an outlier is not limited to the above method. For example, the outlier determining unit 306 may adjust ε of the ε-insensitive function used in SVM regression to detect a delay test result $R_{ij}$ as an outlier among the delay test results $R_{11}$ to $R_{nm}$.

The second determining unit 307 has a function of determining, from among the group of paths $p_i[1]$ to $p_i[K]$ activated by the test pattern ti and based on a calculation result obtained by the second calculating unit 305, a path pk that determines the measured value $D_{ij}$. Specifically, for example, the second determining unit 307 determines for each chip Cj, a path pk that determines the measured value $D_{ij}$ obtained via the test pattern ti.

The second determining unit 307 then may comprehensively judge the results of determinations made for each chip Cj to determine a path pk that determines the measured value $D_{ij}$ obtained via the test pattern ti. The contents of a process executed by the second determining unit 307 will be described later. The result of determination made by the second determining unit 307 is stored, for example, to a diagnosis result table 700 depicted in FIG. 7.

FIG. 7 is an explanatory diagram of an example of the memory contents of the diagnosis result table. As depicted in FIG. 7, the diagnosis result table 700 includes items of test pattern ID, path ID, and subject path ID. Information is set for each item to store diagnosis results 700-1 to 700-*n* as records.

The test pattern ID represents an identifier for identifying each test pattern ti. The path ID represents an identifier for identifying a path pk that determines the measured value $D_{ij}$ obtained via the test pattern ti. The subject path ID represents an identifier for identifying a path pl (k≠1, l=1, 2, . . . , K) that is the subject of noise generation with the path pk. "-(null)" is entered in the subject path ID item if the path pl as the subject of noise generation is not present.

The output unit 310 has a function of outputting the result of determination made by the second determining unit 307. Specifically, for example, the output unit 310 may output the diagnosis results 700-1 to 700-*n* in the diagnosis result table 700. The form of output includes, for example, display on the display 208, printout by the printer 213, and transmission to an external device through the I/F 209. The result of determination may be stored to such memory areas as the RAM 203, the magnetic disk 205, and the optical disk 207.

The contents of a process executed by the second determining unit 307 will be described. In this process, for an arbitrary chip Cj, a path pk determining the measured value $D_{ij}$ is determined from among the group of paths pi[1] to $p_i$[K] activated by a test pattern ti.

The selecting unit 308 selects a second path candidate py (x≠y) different from the first path candidate px, from the group of paths pi[1] to $p_i$[K] activated by the test pattern ti. Specifically, for example, the selecting unit 308 selects a path pk corresponding to the maximum w(pk) among the calculated w($p_i$[1]) to w($p_i$[K]), as the second path candidate py.

The path pk is a path that exerts a large effect on the discrepancy Dev(px)$_{ij}$ between the measured value $D_{ij}$ obtained via the test pattern ti and the predicted delay value dx of the first path candidate px. It is highly possible that the path pk corresponding to w(pk) of a large value is a path whose actual delay exceeds the actual delay of the first path candidate px or a path that generates noise with the first path candidate px.

The selecting unit 308 thus selects a path pk corresponding to w(pk) of a large value, as the second path candidate py. While the path pk corresponding to the maximum w(pk) is selected as the second path candidate py in the description above, the method of selection is not limited hereto. For example, the top three paths pk ranked according to the value of the corresponding w(pk) may be selected as second path candidates py. In this case, a process by the extracting unit 309 and the second determining unit 307, which will be described later, is carried out for each of the paths pk.

The extracting unit 309 has a function of extracting from among the test patterns ti to tn, a test pattern ta yielding a measured value that is determined by the first path candidate px and by which the second path candidate py is not activated.

For example, the extracting unit 309 refers to the first path candidate ID item in the model data table 600 and narrows down a group of test patterns tA yielding measured values $D_{ij}$ that are determined by the first path candidate px. The extracting unit 309 then refers to the activated path ID item in the delay test result file 400 and extracts from the group of test patterns tA, a test pattern ta by which the second path candidate py is not activated.

The extracting unit 309 has a function of extracting from among the test patterns ti to tn, a test pattern tb yielding a measured value that is determined by the second path candidate py and by which the first path candidate px is not activated.

For example, the extracting unit 309 refers to the first path candidate ID item in the model data table 600 and narrows down a group of test patterns tB yielding measured values $D_{ij}$ that are determined by the second path candidate py. The extracting unit 309 then refers to the activated path ID item in the delay test result file 400 and from among the narrowed down group of test patterns tB, extracts the test pattern tb by which the first path candidate px is not activated.

The second determining unit 307 has a function of comparing the measured value $D_{aj}$ obtained via the test pattern ta with the measured value $D_{bj}$ of the test pattern tb and determining at least one among the first path candidate px and the second path candidate py to be the path pk that determines the measured value $D_{ij}$ obtained via the test pattern ti.

For example, the second determining unit 307 refers to measured value item spaces corresponding to delay test results $R_{aj}$ and $R_{bj}$ in the delay test result file 400 to identify the measured value $D_{aj}$ obtained via the test pattern ta and the measured value $D_{bj}$ obtained via the test pattern tb. The second determining unit 307 then compares the measured value $D_{aj}$ obtained via the test pattern ta and the measured value $D_{bj}$ of the test pattern tb.

If the measured value $D_{aj}$ is greater than the measured value $D_{bj}$, the second determining unit 307 determines the first path candidate px to be the path px that determines the measured value $D_{ij}$ obtained via the test pattern ti. In this case, the second determining unit 307 also determines the first path candidate px and the second path candidate py to be a path pair that causes noise. In this manner, a path pair (the first and the second path candidates px and py) generating noise (crosstalk, etc.) on the chip Cj is identified.

If the measured value $D_{bj}$ is greater than the measured value $D_{aj}$, the second determining unit 307 determines the second path candidate py to be the path px that determines the measured value $D_{ij}$ obtained via the test pattern ti. In this manner, the actual delay of the second path candidate py is judged to exceed that of the first path candidates px and the measured value $D_{ij}$ obtained via the test pattern ti is assigned to the proper path pk (second path candidate py).

If the measured value $D_{aj}$ is identical to the measured value $D_{bj}$, the second determining unit 307 may determine any one among the first path candidate px and the second path candidate py to be the path pk that determines the measured value $D_{ij}$ obtained via the test pattern ti.

The extracting unit 309 may extract multiple test patterns ta (tb). In such a case, the measured value $D_{aj}$ ($D_{bj}$) greatest in number among measured values obtained via multiple extracted test patterns ta (tb), for example, may be adopted as the measured value $D_{aj}$ ($D_{bj}$) obtained via the test pattern ta (tb) to be compared by the second determining unit 307.

In another example, the average of measured values remaining after outlier exclusion from measured values obtained via multiple extracted test patterns ta (tb) may be adopted as the measured value $D_{aj}$ ($D_{bj}$). The known Smirnov-Grubbs detection, etc., is available as a method of detecting an outlier.

It is presumed (determined) that the first path candidate px (second path candidate py) determines the measured value obtained via the test pattern ta (tb). If the first path candidate px actually determines the measured value, therefore, the measured values obtained via the multiple extracted test patterns ta (tb) are the same. Here, the value common to the extracted test patterns ta (tb) is the measured value $D_{aj}$ ($D_{bj}$).

The determining process by the second determining unit 307 may be carried out for each of the chips C1 to Cm. In such a case, for each test pattern ti, the result of comparison between the measured value $D_{aj}$ obtained via the test pattern ta and the measured value $D_{bj}$ obtained via the test pattern tb ($D_{aj} > D_{bj}$ or $D_{aj} < D_{bj}$ or $D_{aj} = D_{bj}$) are acquired as m kinds of comparison results.

The number of times of acquisition of a comparison result "$D_{aj} \geq D_{bj}$" is set as "ct1", while the number of times of acquisition of a comparison result "$D_{aj} < D_{bj}$" is set as "ct2" (m=ct1+ct2).

In this embodiment, a systematic failure common to all chips C1 to Cm is the subject of failure diagnosis.

The second determining unit 307, therefore, may determine the path pk determining the measured value $D_{ij}$ obtained via the test pattern ti according to the comparison results greatest in number among m kinds of comparison results.

Specifically, when "ct1>ct2" is satisfied, the second determining unit 307 determines the first path candidate px to be the path pk determining the measured value $D_{ij}$ obtained via the test pattern ti. In this case, the second determining unit 307 also determines the first path candidate px and the second path candidate py to be a path pair that causes noise.

As a result, a diagnosis result 700-i for the test pattern ti is stored as a new record in the diagnosis result table 700. Specifically, the path ID for the first path candidate px is entered in the path ID item space corresponding to the test pattern ti, and the path ID for the second path candidate py is entered in the subject path ID item space.

If "ct1<ct2" is satisfied, the second determining unit 307 determines the second path candidate py to be the path pk determining the measured value $D_{ij}$ obtained via the test pattern ti. In this case, the path ID for the second path candidate py is entered in the path ID item of the record of the diagnosis result 700-i.

If "ct1=ct2" is satisfied, the second determining unit 307 determines the first path candidate px and the second path candidate py to be the paths pk determining the measured value $D_{ij}$ obtained via the test pattern ti. In this case, the path IDs for the first path candidate px and second path candidate py are entered in the path ID item of the record of the diagnosis result 700-i.

The determining process by the second determining unit 307 may be performed once by using the average of measured values $D_{aj}$ ($D_{bj}$) obtained via the test patterns to (tb) in all chips C1 to Cm. This eliminates a need for counting "ct1" and "ct2" in determining the path pk determining the measured value $D_{ij}$ obtained via the test pattern ti.

Figure 8:
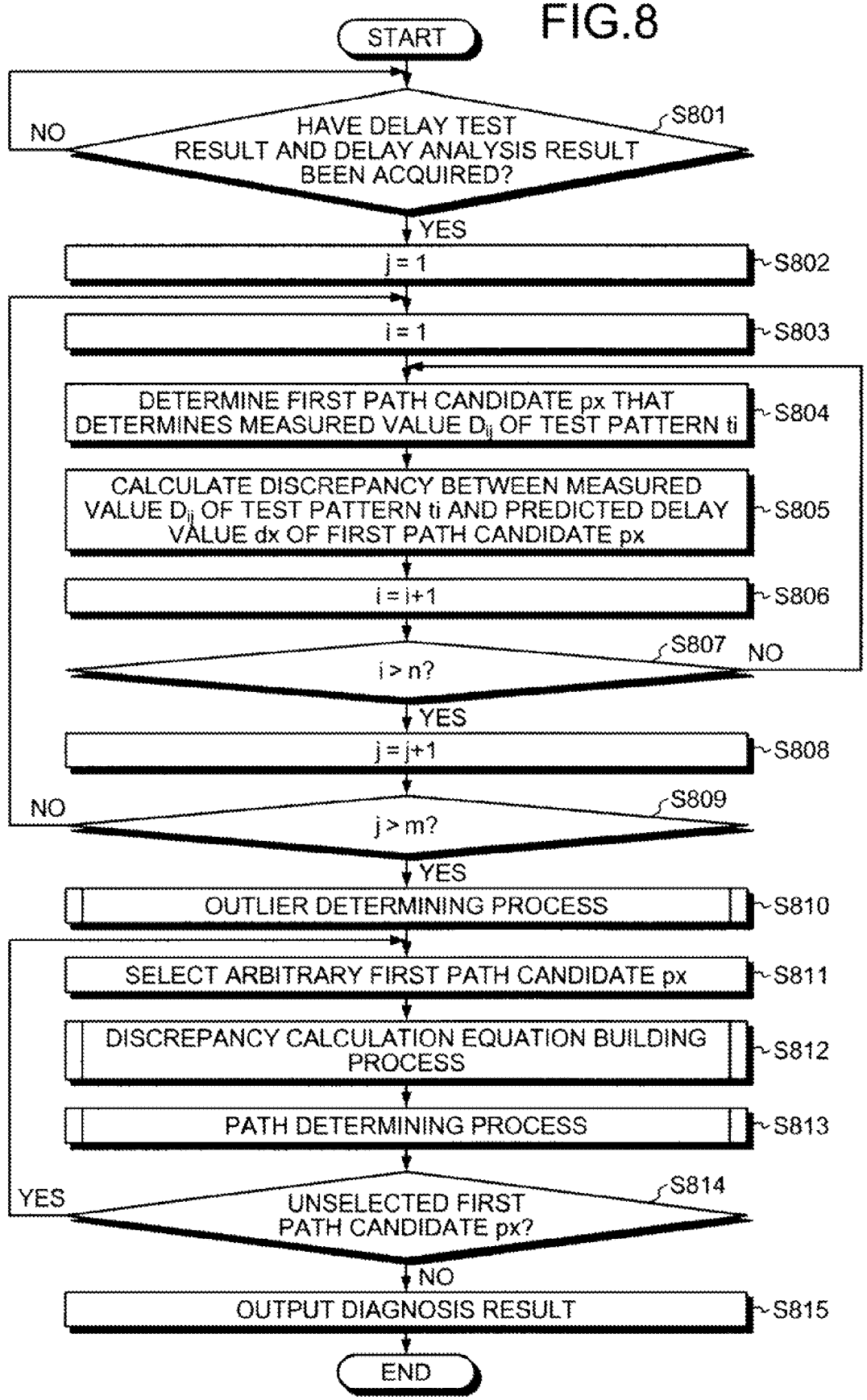
FIG. 8 is a flowchart of an example of a failure diagnosis support procedure by the failure diagnosis support apparatus.

FIG. 8 is a flowchart of an example of a failure diagnosis support procedure by the failure diagnosis support apparatus. As depicted in the flowchart, the acquiring unit 301 determines whether the delay test results $R_{11}$ to $R_{nm}$ for the chips C1 to Cm to be diagnosed and the delay analysis result 500 have been acquired (step S801).

Acquisition of the delay test results $R_{11}$ to $R_{nm}$ and the delay analysis result 500 is awaited (step S801: NO). When the delay test results $R_{11}$ to $R_{nm}$ and delay analysis result 500 have been acquired (step S801: YES), the first determining unit 302 initializes "j" to set "j=1" (step S802) and initializes "i" to set "i=1" (step S803).

Based on the predicted delay value dk of each path pk in the chip Cj and from among the group of paths $p_i[1]$ to $p_i[K]$ activated by the test pattern ti, the first determining unit 302 then determines the first path candidate px determining the measured value $D_{ij}$ of the test pattern ti (step S804). The result of determination by the first determining unit 302 is entered together with the corresponding delay test result ID and test pattern ID in their respective item spaces in the model data table 600 to be stored as a new record.

Subsequently, the first calculating unit 303 calculates the discrepancy between the measured value $D_{ij}$ obtained via the test pattern ti and the predicted delay value dx of the first path candidate px (step S805). The result of calculation is entered in the discrepancy item of the corresponding record in the model data table 600.

The first determining unit 302 then increases "i" by 1 (step S806), and determines whether "i" is greater than "n" (step S807). If "i" is equal to or less than "n" (step S807: NO), the procedure returns to step S804. If "i" is greater than "n" (step S807: YES), the first determining unit 302 increases "j" by 1 (step S808), and determines whether "j" is greater than "m" (step S809).

If "j" is equal to or less than "m" (step S809: NO), the procedure returns to step S803. If "j" is greater than "m" (step S809: YES), the outlier determining unit 306 carries out an outlier determining process of determining an outlier from among the delay test results $R_{11}$ to $R_{nm}$ (step S810).

Subsequently, the building unit 304 refers to the model data table 600 to select an arbitrary first path candidate px from among a group of first path candidates determined at step S804 (step S811). The building unit 304 then carries out a discrepancy calculation equation building process of building a discrepancy calculation equation $E(px)_{ij}$ for the test pattern ti yielding a measured value $D_{ij}$ that is determined by the first path candidate px (step S812).

The second determining unit 307 carries out a path determining process of determining, from among the group of paths $p_i[1]$ to $p_i[K]$ activated by the test pattern ti, the path pk determining the measured value $D_{ij}$ (step S813). The second determining unit 307 then determines whether an unselected first path candidate px not selected from the group of first path candidates is present (step S814).

If an unselected first path candidate px is present (step S814: YES), the procedure returns to step S811. If an unselected first path candidate px is not present (step S814: NO), the output unit 310 outputs the diagnosis results 700-1 to 700-n stored in the diagnosis result table 700 (step S815), ending a series of operations depicted in the flowchart.

Through this procedure, the measured value $D_{ij}$ obtained via the test pattern ti acquired by a delay test on the chip Cj to be diagnosed can be assigned properly to a path pk.

Figure 9:
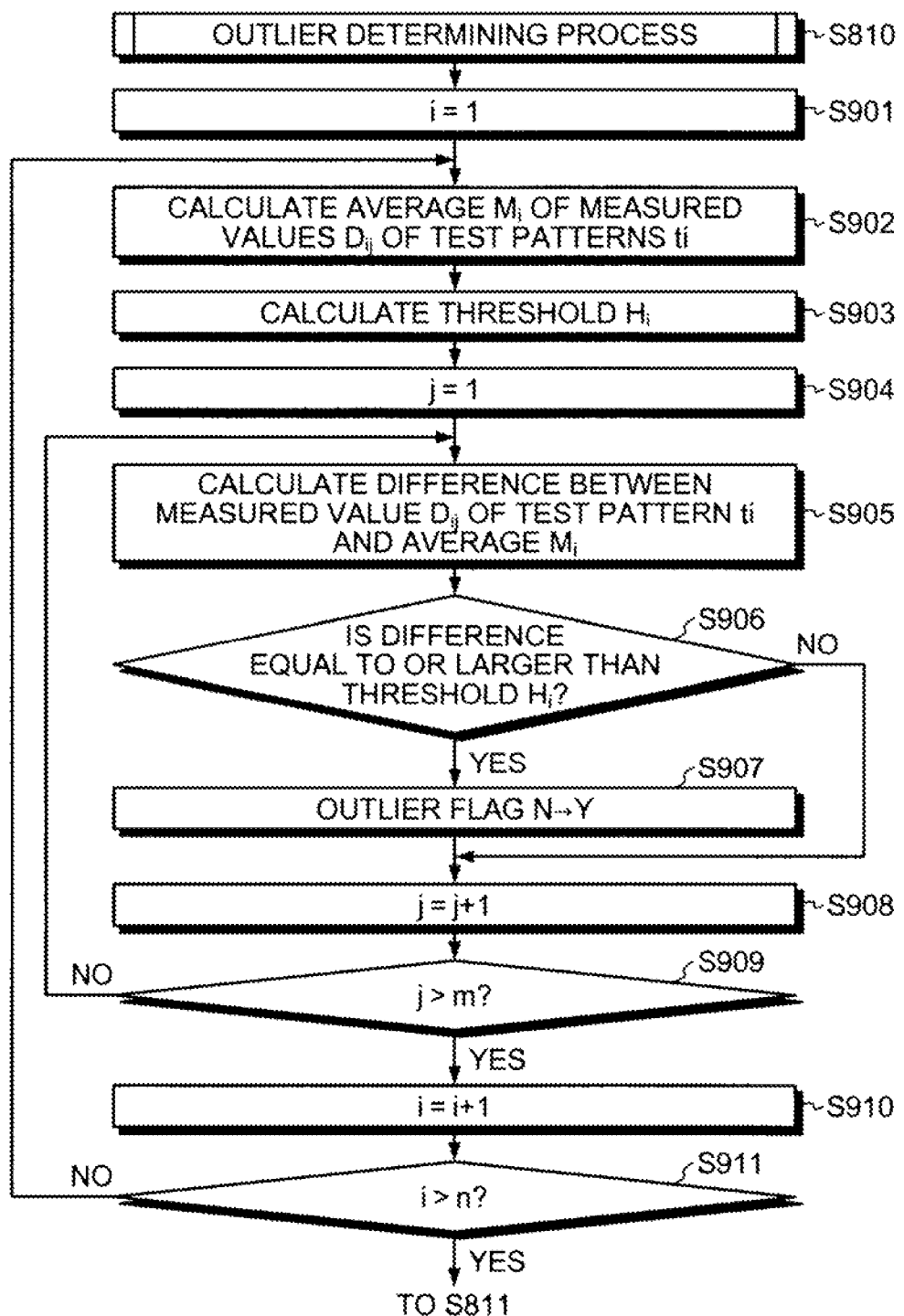
FIG. 9 is a flowchart of an example of a procedure of an outlier determining process.

FIG. 9 is a flowchart of an example of a procedure of the outlier determining process. As depicted in the flowchart, the first calculating unit 303 initializes "i" to set "i=1" (step S901).

Subsequently, the first calculating unit 303 calculates the average $M_i$ of measured values $D_{ij}$ obtained via test patterns ti in all chips Ci to Cm (step S902). The first calculating unit 303 then calculates a[%] of the average $M_i$ of the measured values $D_{ij}$ obtained via test patterns ti to calculate the threshold $H_i$ (step S903).

The outlier determining unit 306 initializes "j" to set "j=1" (step S904), and calculates the difference between the measured value $D_{ij}$ obtained via the test pattern ti and the average $M_i$ (step S905). The outlier determining unit 306 then determines whether the calculated difference is at least equal to the threshold $H_i$ (step S906).

If the difference is less than the threshold $H_i$ (step S906: NO), the procedure proceeds to step S908. If the difference is equal to or greater than the threshold $H_i$ (step S906: YES), the outlier determining unit 306 enters "Y" in the outlier flag item of the record corresponding to the test pattern ti (step S907).

Subsequently, the outlier determining unit 306 increases "j" by 1 (step S908), and determines whether "j" is greater than "m" (step S909). If "j" is equal to or less than "m" (step S909: NO), the procedure returns to step S905.

If "j" is greater than "m" (step S909: YES), the outlier determining unit 306 increases "i" by 1 (step S910), and determines whether "i" is greater than "n" (step S911).

If "i" is equal to or less than "n" (step S911: NO), the procedure returns to step S902. If "i" is greater than "n" (step S911: YES), the procedure proceeds to step S811 depicted in FIG. 8.

Through this procedure, the delay test result $R_{ij}$ including a discrepancy caused by elements of delay failures, random irregularities, etc., is excluded as an outlier from delay test results for which the discrepancy calculation equation $E(px)_{ij}$ is to be built.

Figure 10:
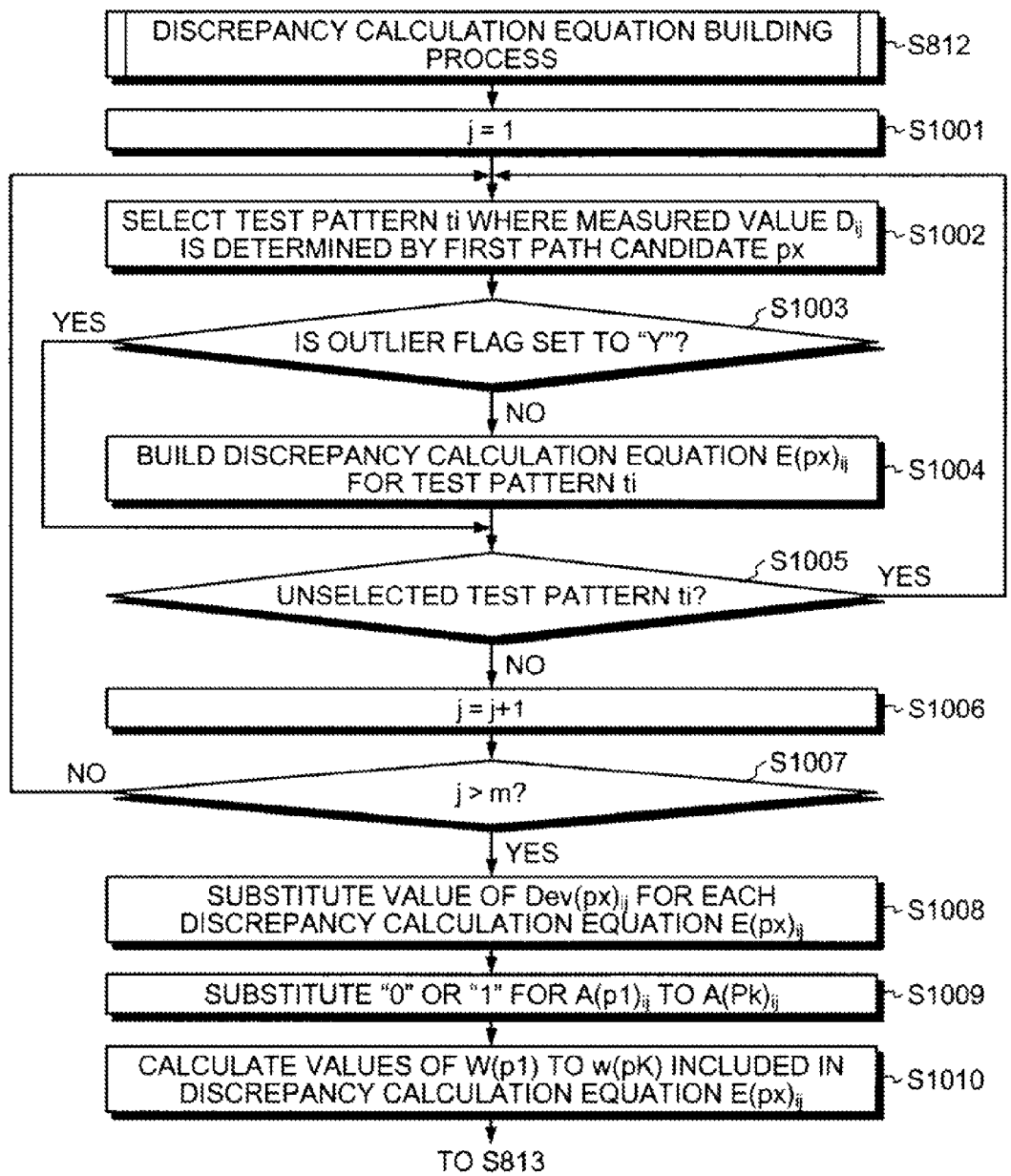
FIG. 10 is a flowchart of an example of a procedure of a discrepancy calculation equation building process.

FIG. 10 is a flowchart of an example of a procedure of the discrepancy calculation equation building process. As depicted in the flowchart, the building unit 304 initializes "j" to set "j=1" (step S1001).

The building unit 304 then selects, from among the group of test patterns ti to tn, a test pattern ti yielding a measured value $D_{ij}$ that is determined by the first path candidate px (step S1002). Subsequently, the building unit 304 determines whether "Y" has been entered in the outlier flag item space corresponding to the delay test result $R_{ij}$ in the model data table 600 (step S1003).

If "Y" has been entered in the outlier flag item (step S1003: YES), the procedure proceeds to step S1005. If "N" has been entered in the outlier flag item (step S1003: NO), the building unit 304 builds a discrepancy calculation equation $E(px)_{ij}$ for the test pattern ti (step S1004).

The building unit 304 then determines whether an unselected test pattern ti not selected at step S1002 is present, the measured value $D_{ij}$ of which is determined by the first path candidate px (step S1005). If an unselected test pattern ti is present (step S1005: YES), the procedure returns to step S1002.

If an unselected test pattern ti is not present (step S1005: NO), the building unit 304 increases "j" by 1 (step S1006), and determines whether "j" is greater than "m" (step S1007). If "j" is equal to or less than "m" (step S1007: NO), the procedure returns to step S1002.

If "j" is greater than "m" (step S1007: YES), the second calculating unit 305 refers to the model data table 600 and substitutes $Dev(px)_{ij}$ for each discrepancy calculation equation $E(px)_{ij}$ (step S1008). This $Dev(px)_{ij}$ represents the discrepancy calculated at step S805 depicted in FIG. 8.

The second calculating unit 305 then refers to the activated path ID item space corresponding to the delay test result $R_{ij}$ and substitutes "0" or "1" for $A(p1)_{ij}$ to $A(pK)_{ij}$ included in each discrepancy calculation equation $E(px)_{ij}$ (step S1009).

The second calculating unit 305 thus solves a regression problem using the multiplicity of discrepancy calculation equations $E(px)_{ij}$ to calculate the values of $w(p1)$ to $w(pK)$ included in each discrepancy calculation equation $E(px)_{ij}$ (step S1010), after which the procedure proceeds to step S813 depicted in FIG. 8.

Through this procedure, the effect that each of paths $p_i[1]$ to $p_i[K]$ simultaneously activated by the test pattern ti exerts on $Dev(px)_{ij}$ is statistically calculated using the delay test results $R_{11}$ to $R_{nm}$ for the chips C1 to Cm.

Figure 11:
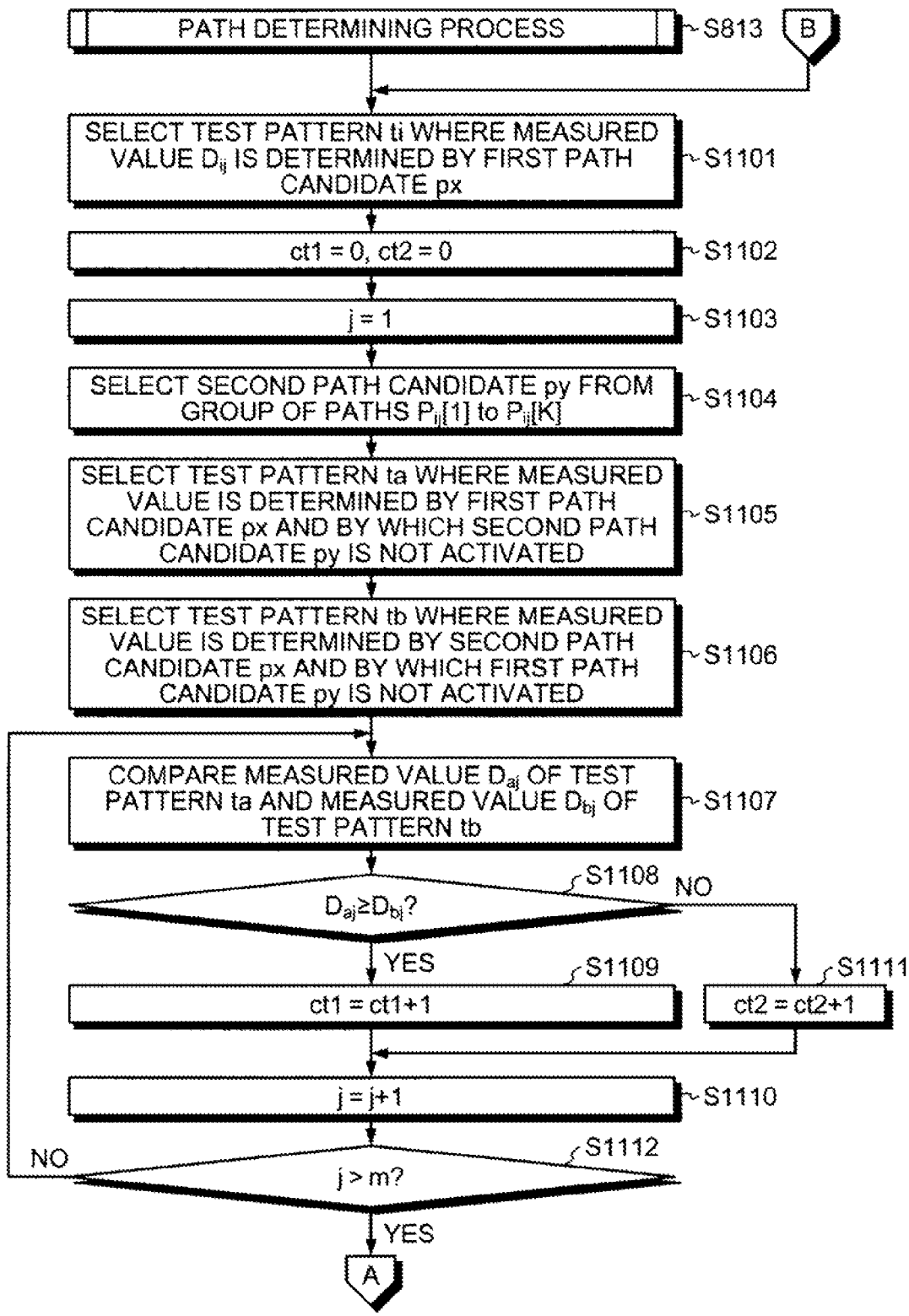
FIGS. 11 and 12 are flowcharts of an example of a procedure of a path determining process.
Figure 12:
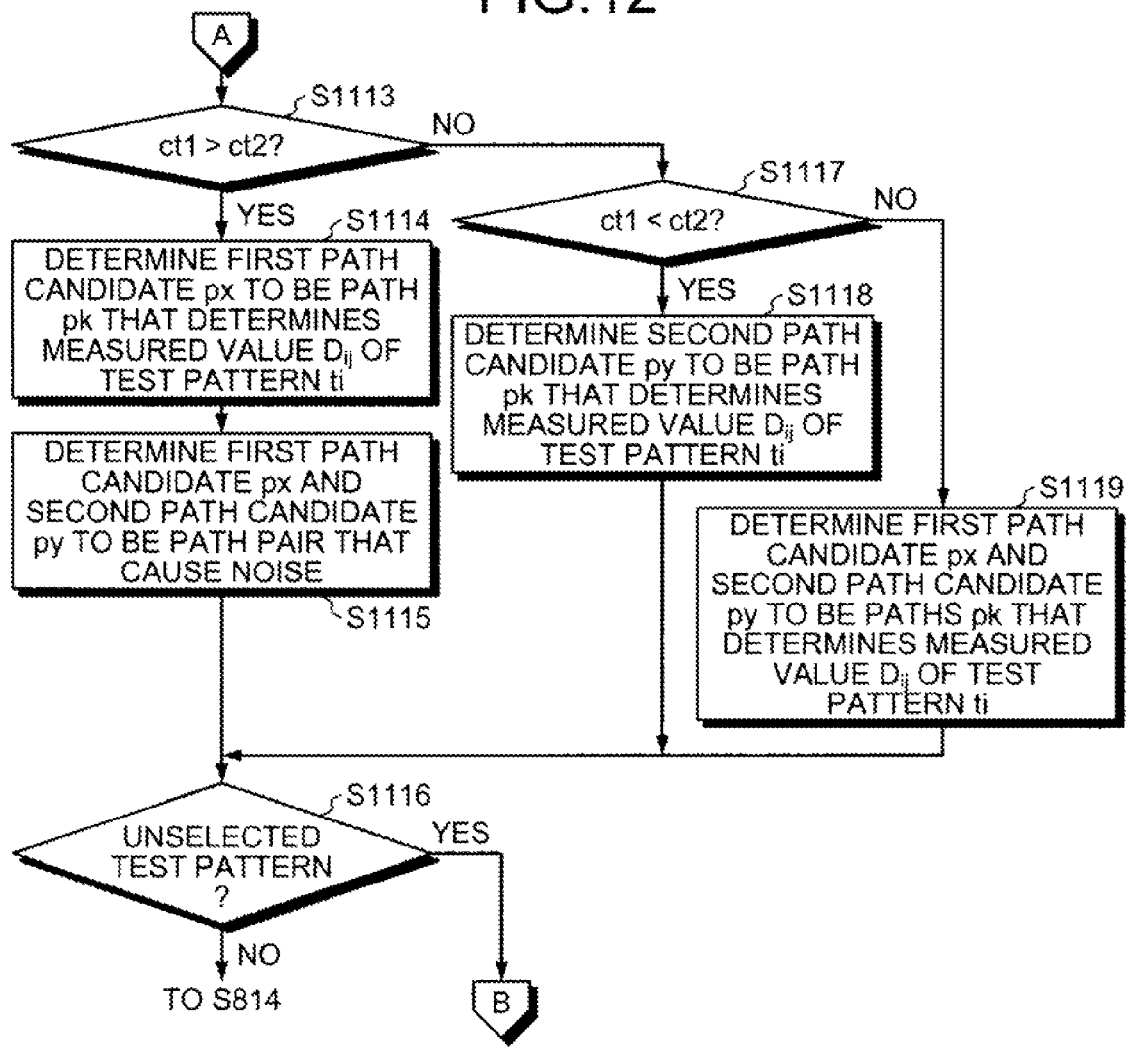

FIGS. 11 and 12 are flowcharts of an example of a procedure of the path determining process. As depicted in the flowchart, the selecting unit 308 selects from among the group of test patterns ti to tn, a test pattern ti yielding a measured value $D_{ij}$ that is determined by the first path candidate px (step S1101).

Subsequently, the selecting unit 308 initializes "ct1" and "ct2" to set "ct1=0, ct2=0" (step S1102). The selecting unit 308 then initializes "j" to set "j=1" (step S1103).

The selecting unit 308 selects a second path candidate py (x≠y) from among the group of paths $p_i[1]$ to $p_i[K]$ activated by the test pattern ti (step S1104). Subsequently, the extracting unit 309 extracts the test pattern ta yielding a measured value that is determined by the first path candidate px and by which the second path candidate py is not activated, from the group of test patterns ti to tn (step S1105).

The extracting unit 309 further extracts from the group of test patterns ti to tn, a test pattern tb yielding a measured value that is determined by the second path candidate py and by which the first path candidate px is not activated (step S1106). The second determining unit 307 then compares the measured value $D_{aj}$ obtained via the test pattern ta and the measured value $D_{bj}$ obtained via the test pattern tb (step S1107).

The second determining unit 307 determines whether the measured value $D_{aj}$ is at least equal to the measured value $D_{bj}$ (step S1108). If the measured value $D_{aj}$ is equal to or greater than the measured value $D_{bj}$ (step S1108: YES), the second determining unit 307 increases "ct1" by 1 (step S1109), after which the procedure proceeds to step S1110.

If the measured value $D_{aj}$ is less than the measured value $D_{bj}$ (step S1108: NO), the second determining unit 307 increases "ct2" by 1 (step S1111). The second determining unit 307 then increases "j" by 1 (step S1110), and determines whether "j" is greater than "m" (step S1112).

If "j" is equal to or less than "m" (step S1112: NO), the procedure returns to step S1107. If "j" is greater than "m" (step S1112: YES), the procedure proceeds to step S1113 depicted in FIG. 12.

As depicted in the flowchart of FIG. 12, the second determining unit 307 determines whether "ct1" is greater than "ct2" (step S1113). If "ct1" is greater than "ct2" (step S1113: YES), the second determining unit 307 determines the first path candidate px to be the path pk determining the measured value $D_{ij}$ obtained via the test pattern ti (step S1114).

The second determining unit 307 further determines the first path candidate px and the second path candidate py to be a noise pair that causes noise (step S1115), after which the procedure proceeds to step S1116. The result of determination by the second determining unit 307 is stored to the diagnosis result table 700 as a new record.

If "ct1" is equal to or less than "ct2" at step S1113 (step S1113: NO), the second determining unit 307 determines whether "ct2" is greater than "ct1" (step S1117).

If "ct2" is greater than "ct1" (step S1117: YES), the second determining unit 307 determines the second path candidate py to be the path pk determining the measured value $D_{ij}$ obtained via the test pattern ti (step S1118), after which the procedure proceeds to step S1116. The result of determination by the second determining unit 307 is stored to the diagnosis result table 700 as a new record.

If "ct1" is equal to "ct2" (step S1117: NO), the second determining unit 307 determines the first path candidate px and the second path candidate py to be the paths pk determining the measured value $D_{ij}$ obtained via the test pattern ti (step S1119).

Subsequently, the selecting unit 308 determines whether a test pattern ti not selected from among the group of test patterns ti to tn and yielding a measured value $D_{ij}$ that is determined by the first path candidate px, is present (step S1116).

If an unselected test pattern ti is present (step S1116: YES), the procedure returns to step S1101 of FIG. 11. If an unselected test pattern ti is not present (step S1116: NO), the procedure proceeds to step S814 of FIG. 8.

Through this process, a second path candidate py for which actual delay exceeds that of the first path candidate px or that generates noise with the first path candidate px can be selected appropriately. The measured values $D_{aj}$ and $D_{bj}$ obtained via the test patterns ta and tb are used to determine whether "the actual delay of the second path candidate py exceeds that of the first path candidate px" or "noise generation" occurs between the first and second path candidates px and py making it possible to determine the path pk determining the measured value $D_{ij}$ obtained via the test pattern ti.

As described above, according to this embodiment, the discrepancy between the predicted delay and the actual delay of each of paths pi[1] to pi[K] simultaneously activated by the test pattern ti is statistically calculated, using the delay test results $R_{11}$ to $R_{nm}$ for the chips C1 to Cm. This enables proper selection of the second path candidate py for which the actual delay exceeds that of the first path candidate px or that generates noise with the first path candidate px.

According to this embodiment, whether "the actual delay of the second path candidate py exceeds that of the first path candidate px" or "noise generation" occurs between the first and second path candidates px and py is determined using the measured values $D_{aj}$ and $D_{bj}$ obtained via the test patterns ta and tb different from the test pattern ti. As a result, the path pk determining the measured value $D_{ij}$ obtained via the test pattern ti is identified to be able to assign the measured value $D_{ij}$ to the appropriate path pk, and a path pair causing noise on the chip Cj (first and second path candidates px and py) is identified making it possible to extract the effects of noise on the chip Cj.

In this embodiment, the path pk having the greatest predicted delay among the group of paths pi[1] to pi[K] activated by the test pattern ti may be determined to be the first path candidate pk determining the measured value $D_{ij}$ obtained via the test pattern ti. In this manner, the path pk that determines measured values $D_{ij}$ obtained via many test patterns ti is determined to be the first path candidate px to be able to increase the volume of data to be processed in statistical analysis.

In this embodiment, the path pk corresponding to w(pk) greatest in value among w(p1) to w(pK) included in the discrepancy calculating equation $E(pk)_{ij}$ for the test pattern ti may be selected as the second path candidate py. Thus, the path pk that is highly likely to be the path whose the actual delay exceeds that of the first path candidate px or that generates noise with the first path candidate px can be set as the second path candidate py.

In this embodiment, the delay test result $R_{ij}$ including a discrepancy caused by elements of delay failures, random irregularities, etc., may be excluded as an outlier from delay test results from which the discrepancy calculation equation $E(px)_{ij}$ is to be build. Hence, the delay test result $R_{ij}$ including an unnecessary discrepancy is excluded to be able to more accurately calculate the discrepancy between the predicted delay value dk and the actual delay of the path pk.

Therefore, according to this embodiment, the measured value $D_{ij}$ obtained via the test pattern ti is assigned appropriately to the path pk to improve the reliability of failure diagnosis.

Speed path analysis utilizing a diagnosis result (e.g., diagnosis results 700-1 to 700-n) acquired from the failure diagnosis support apparatus 200 will be described. The speed path analysis may be carried out by the failure diagnosis support apparatus 200 or by a computer other than the failure diagnosis support apparatus 200.

In the speed path analysis, stricter failure diagnosis is carried out to identify a failure cause that creates a discrepancy $Dev(p)_{ij}$ between the measured value $D_{ij}$ obtained via a test pattern ti and the predicted delay dP of a path P. The path P is a path that determines the measured value $D_{ij}$ obtained via the test pattern ti.

In the speed path analysis, a set of paths P, the measured value $D_{ij}$ obtained via the test pattern ti, and the predicted delay dP of each path P are given as input data to the failure diagnosis support apparatus 200 to identify a failure cause among a group of failure cause candidates for each path P. Failure cause candidates include, for example, the number of leak reducing gates included in the path P, the position of the path P on a chip, and the number of times of switching operations in an area where the path P is present.

When the path P, which determines the measured value $D_{ij}$ obtained via the test pattern ti, changes from the first path candidate px to the second path candidate py, the predicted delay dP of the path P processed in the speed path analysis and the group of failure cause candidates change, thus leading to a change in the result of failure diagnosis by the speed path analysis.

A speed path analysis procedure will be described. In the speed path analysis, each path P is expressed as a vector. Specifically, for example, the path P is expressed as a vector using equation (4). Changing of the path P, which determines the measured value $D_{ij}$ obtained via the test pattern ti, from the first path candidate px to the second path candidate py results in a change in vector components of the path P.

In equation (4), $g_L[P]$ denotes the number of leak reducing gates included in the path P, loc1[P] to locN[P] are variables that take a value "1" when the path P is present in areas on the chip C that are defined as loc1 to locN and take a value "0" when the path P is not present, and Sw(P) denotes the number of times switching is executed by a gate in an area including the path P.

$$\vec{P} = \begin{pmatrix} g_L[P] \\ loc1[P] \\ loc2[P] \\ \vdots \\ \vdots \\ locN[P] \\ Sw[P] \end{pmatrix} \quad (4)$$

In the speed path analysis, a model equation of each path P expressed as a vector is built using equation (5).

In equation (5), Dev(P) denotes the discrepancy [ps] between the measured value $D_{ij}$ obtained via the test pattern ti and the predicted delay dP of the path P, $w_g[P]$, $w_1[P]$ to $w_N[P]$, and $w_S[P]$ denote variables representing weights applied to the discrepancy between the measured value $D_{ij}$ obtained via the test pattern ti and the predicted delay dP of the path P, and C denotes a constant.

$$Dev(P) = w_g[P] \times g_L[P] + w_1[P] \times loc1[P] + w_2[P] \times loc2[P] + \ldots + w_N[P] \times locN[P] + w_S[P] \times Sw(P) + C \quad (5)$$

In the speed path analysis, a regression problem is solved, using a multiplicity of model equations built on equation (5), to calculate $w_g[P]$, $w_1[P]$ to $w_N[P]$, and $w_S[P]$ and C. Hence, the vector component corresponding to one of $w_g[P]$ and $_{w1}$[P] to $_{wN}$[P] having a large value (e.g., the greatest value), i.e., one having a large weight to the discrepancy is identified as a failure cause.

According to the working example as described above, the speed path analysis is carried out using the result of diagnosis made by assigning the measured value $D_{ij}$ obtained via the test pattern ti to the proper path P. This enables highly precise failure diagnosis.

FIG. 13 is an explanatory diagram of an example of a failure diagnosis result. FIG. 13 depicts a bar graph 1300 representing a failure diagnosis result on a chip subject to diagnosis. The vertical axis indicates the values of weights denoted by $_{wg}$[P]. $_{w1}$[P] to $_{wN}$[P], and $_{wS}$[P], which are normalized with the maximum weight set to 100, and the horizontal axis indicates each weight $_{wg}$[P], $_{w1}$[P] to $_{wN}$[P] and $_{wS}$[P]

As depicted by the bar graph 1300, for example, among $_{wg}$[P], $_{w1}$[P] to $_{wN}$[P], and $_{wS}$[P], $_{wg}$[P] and $_{wS}$[P] are of large weights. Hence, the number of leak reducing gates and the number of times switching operations are executed on the chip can be identified as the causes of a delay failure.

The failure diagnosis support method described in the present embodiment may be implemented by executing a prepared program on a computer such as a personal computer and a workstation. The program is stored on a computer-readable, non-transitory medium such as a hard disk, a flexible disk, a CD-ROM, an MO, and a DVD, read out from the recording medium, and executed by the computer. The program may be a transmission medium that can be distributed through a network such as the Internet.

The embodiment effects proper assignment of a measured value obtained via a test pattern to a path and improves the reliability of failure diagnosis.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A computer-readable, non-transitory medium storing therein a failure diagnosis support program that causes a computer to execute a procedure, the procedure comprising:
    determining, for each test pattern used to measure operation frequency of a circuit subject to diagnosis, a path candidate that determines a measured value obtained via the test pattern, the path candidate being among a group of paths activated by the test pattern and determined based on a predicted delay of each path in the circuit;
    building, for each test pattern yielding a measured value that is determined by a given path candidate among path candidates determined at the determining, a model equation expressing a discrepancy between the measured value obtained via the test pattern and the predicted delay of the given path candidate, the model equation including parameters representing effects of each path activated by the test pattern on the discrepancy between the measured value obtained via the test pattern and the predicted delay of the given path candidate;
    calculating values of the parameter by using the model equations built at the building;
    determining from among the group of paths activated by the test pattern and based on a calculation result obtained at the calculating, a path that determines the measured value obtained via the test pattern; and
    outputting a determination result obtained at the determining a path.

2. The computer-readable, non-transitory medium according to claim 1, further comprising:
    selecting from among the group of paths activated by the test pattern and based on a value of the parameter included in the model equation for the test pattern, another path candidate different from the given path candidate;
    extracting a first test pattern from among the test patterns for measuring the operation frequency of the circuit, the first test pattern being determined at the determining to be a test pattern yielding a measured value that is determined by the given path candidate and by which the other path candidate is not activated; and
    extracting a second test pattern from among the test patterns, the second test pattern being determined at the determining to be a test pattern yielding a measured value that is determined by the other path candidate and by which the given path candidate is not activated, wherein
    the determining a path includes comparing measured values obtained via the first and the second test patterns extracted at the extracting and determining one among the given path candidate and the other path candidate to be a path that determines the measured value obtained via the test pattern.

3. The computer-readable, non-transitory medium according to claim 2, wherein the selecting includes selecting as the other path candidate, a path corresponding to a parameter that is at least greater in value than other parameters included in the model equation for the test pattern.

4. The computer-readable, non-transitory medium according to claim 2, wherein the determining a path includes determining the given path candidate to be a path that determines the measured value obtained via the test pattern and determining the given path candidate and the separate path candidate to be a path pair that cause noise, when the measured value obtained via the first test pattern is greater than the measured value obtained via the second test pattern.

5. The computer-readable, non-transitory medium according to claim 2, wherein the determining a path includes determining the other path candidate to be a path that determines the measured value obtained via the test pattern, when the measured value obtained via the second test pattern is greater than the measured value obtained via the first test pattern.

6. The computer-readable, non-transitory medium according to claim 1, wherein the building includes building a model equation for each circuit manufactured using circuit information concerning the circuit.

7. The computer-readable, non-transitory medium according to claim 1, further comprising:
    calculating for the each test pattern, an average of measured values obtained for each circuit by giving the test pattern to the circuit manufactured using circuit information concerning the circuit to be diagnosed; and
    determining based on an average calculated at the calculating an average, an outlier among measured values obtained for each circuit, wherein
    the building includes excluding from test patterns for which a model equation is to be built, a test pattern yielding a measured value that is determined to be an outlier at the determining an outlier and is among a plurality of test patterns determined to be test patterns yielding measured values that are determined by the given path.

8. The computer-readable, non-transitory medium according to claim 1, wherein the determining a path candidate includes determining as the path candidate, a path for which the predicted delay is greatest among the group of paths activated by the test pattern.

9. A failure diagnosis support apparatus comprising:
a processor configured to execute a procedure, the procedure comprising:
  determining, for each test pattern used to measure operation frequency of a circuit subject to diagnosis, a path candidate that determines a measured value obtained via the test pattern, the path candidate being among a group of paths activated by the test pattern and determined based on a predicted delay of each path in the circuit;
  building, for each test pattern yielding a measured value that is determined by a given path candidate among path candidates determined at the determining, a model equation expressing a discrepancy between the measured value obtained via the test pattern and the predicted delay of the given path candidate, the model equation including parameters representing effects of each path activated by the test pattern on the discrepancy between the measured value obtained via the test pattern and the predicted delay of the given path candidate;
  calculating values of the parameter by using the model equations built at the building;
  determining from among the group of paths activated by the test pattern and based on a calculation result obtained at the calculating, a path that determines the measured value obtained via the test pattern; and
  outputting a determination result obtained at the determining a path.

10. A failure diagnosis support method comprising:
determining, for each test pattern used to measure operation frequency of a circuit subject to diagnosis, a path candidate that determines a measured value obtained via the test pattern, the path candidate being among a group of paths activated by the test pattern and determined based on a predicted delay of each path in the circuit;
building, for each test pattern yielding a measured value that is determined by a given path candidate among path candidates determined at the determining, a model equation expressing a discrepancy between the measured value obtained via the test pattern and the predicted delay of the given path candidate, the model equation including parameters representing effects of each path activated by the test pattern on the discrepancy between the measured value obtained via the test pattern and the predicted delay of the given path candidate;
calculating values of the parameter by using the model equations built at the building;
determining from among the group of paths activated by the test pattern and based on a calculation result obtained at the calculating, a path that determines the measured value obtained via the test pattern; and
outputting a determination result obtained at the determining a path.

* * * * *